(12) United States Patent
Oh et al.

(10) Patent No.: US 11,045,007 B2
(45) Date of Patent: Jun. 29, 2021

(54) FOOTHOLD INCLUDING THERMOELECTRIC MODULE

(71) Applicant: LG ELECTRONICS INC., Seoul (KR)

(72) Inventors: Minkyu Oh, Seoul (KR); Yanghwan No, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 47 days.

(21) Appl. No.: 16/670,012

(22) Filed: Oct. 31, 2019

(65) Prior Publication Data

US 2020/0154895 A1 May 21, 2020

(30) Foreign Application Priority Data

Nov. 20, 2018 (KR) .................... 10-2018-0143398

(51) Int. Cl.
| | |
|---|---|
| *A47C 16/02* | (2006.01) |
| *A47C 7/74* | (2006.01) |
| *A61F 7/00* | (2006.01) |
| *F24H 3/02* | (2006.01) |
| *F24H 3/04* | (2006.01) |
| *H01L 35/32* | (2006.01) |

(52) U.S. Cl.
CPC .............. *A47C 16/02* (2013.01); *A47C 7/742* (2013.01); *A47C 7/744* (2013.01); *A47C 7/748* (2013.01); *F24H 3/022* (2013.01); *F24H 3/0417* (2013.01); *H01L 35/32* (2013.01)

(58) Field of Classification Search
None
See application file for complete search history.

(56) References Cited

U.S. PATENT DOCUMENTS

| | | | | |
|---|---|---|---|---|
| 1,460,915 | A * | 7/1923 | Luton ........................... | 126/204 |
| 3,032,634 | A * | 5/1962 | Steinel ...................... | A61F 7/02 219/521 |
| 4,782,664 | A * | 11/1988 | Sterna ..................... | F25B 21/02 62/3.3 |
| 5,157,850 | A * | 10/1992 | Terng-Shuh ............ | F26B 9/003 34/202 |
| 5,491,908 | A * | 2/1996 | Ruiz ...................... | A47K 10/48 34/202 |

(Continued)

FOREIGN PATENT DOCUMENTS

| | | | | |
|---|---|---|---|---|
| CA | 2783050 A1 * | 1/2013 | ........... | F24H 3/0417 |
| JP | 0951833 A | 2/1997 | | |

(Continued)

OTHER PUBLICATIONS 22 page PDF of machine translation of JP 2002369834A. (Year: 2002).*

(Continued)

*Primary Examiner* — Robert Canfield
(74) *Attorney, Agent, or Firm* — Dentons US LLP

(57) ABSTRACT

A foothold including a thermoelectric module includes a body having an air channel in which a suction fan is provided and a dissipation channel in which a dissipation fan is provided, and a cover including an air discharge portion disposed on the body. Further, the thermoelectric element is disposed between the dissipation heat sink and the cover.

20 Claims, 13 Drawing Sheets

(56) References Cited

U.S. PATENT DOCUMENTS

| | | | |
|---|---|---|---|
| 6,580,060 B1* | 6/2003 | Inman | B60N 2/5635 219/217 |
| 6,799,804 B1* | 10/2004 | Fournier | A47C 16/02 297/217.3 |
| 2002/0092308 A1* | 7/2002 | Bell | B60N 2/5678 62/3.7 |
| 2005/0000231 A1* | 1/2005 | Lee | A41D 13/0025 62/3.5 |
| 2006/0027551 A1* | 2/2006 | Dehli | A47C 16/02 219/217 |
| 2006/0108852 A1* | 5/2006 | Boucher | A47C 16/02 297/423.41 |
| 2006/0175877 A1* | 8/2006 | Alionte | B60N 2/5635 297/180.14 |
| 2008/0182071 A1* | 7/2008 | Cheng | A47C 7/748 428/138 |
| 2009/0022485 A1* | 1/2009 | Madden | A47K 10/48 392/380 |
| 2017/0176061 A1* | 6/2017 | Moran | F25B 27/002 |
| 2020/0154894 A1* | 5/2020 | Oh | H01L 35/30 |
| 2021/0022564 A1* | 1/2021 | Yoo | A61H 35/006 |

FOREIGN PATENT DOCUMENTS

| | | | |
|---|---|---|---|
| JP | 2002143267 A | | 5/2002 |
| JP | 2002369834 A | | 12/2002 |
| KR | 10-2009-0032466 | * | 4/2009 |
| KR | 20-0452230 | * | 2/2011 |
| KR | 1020110101363 A | | 9/2011 |
| KR | 10-2013-0066328 A | | 6/2013 |
| KR | 1020140063176 A | | 5/2014 |
| KR | 101793866 B1 | | 11/2017 |

OTHER PUBLICATIONS 13 page PDF of machine translation of KR 10-2014-0063176. (Year: 2014).*

5 page PDF of machine translation of JPH 0951833-A. (Year: 1997).*

* cited by examiner

FOOTHOLD INCLUDING THERMOELECTRIC MODULE

CROSS-REFERENCE TO RELATED APPLICATIONS

This application claims priority under 35 U.S.C. 119 and 35 U.S.C. 365 to Korean Patent Application No. 10-2018-0143398 filed on Nov. 20, 2018 in Korea, the entire contents of which is hereby incorporated by reference in its entirety.

FIELD OF THE DISCLOSURE

The present disclosure is related to a foothold including a thermoelectric module.

BACKGROUND

When sitting and studying at a desk, sometimes a person feels hot or cold at their lower body. This is because the sides and the front of the desk are closed to the outside, so ventilation is poor. In particular, during the summer season with the hot weather, even if an air conditioner is operated, cold air does not reach well into the space under the desk, so the person feels hot at their lower body, and sweats if severe. In this situation, if the person is studying, there is a problem that the person's concentration decreases, and their learning performance deteriorates.

In order to solve this problem, there is inconvenience in that the person has to put and operate a discrete cooling device such as a mobile air conditioner or an electric fan at the side of the desk.

SUMMARY

In order to solve the problems described above, the disclosure describes a foothold including a thermoelectric module, the foothold being able to make a user feel comfortable by supplying conditioned air to their lower body, particularly, the feet.

One aspect is to provide a foothold including a thermoelectric module, the foothold being able to configure a compact cold air generator supplying cold air to the user's feet.

Another aspect is to provide a foothold including a thermoelectric module, the foothold being able to configure a compact heat generator supplying hot air to the user's feet.

The disclosure describes a foothold including a thermoelectric module, the foothold being able to supply cold air to user's both feet by configuring at least two cold air channels.

One aspect is to provide a foothold including a thermoelectric module in which air that has passed through a heat dissipation heat sink can smoothly flow by configuring a heat dissipation channel between two cold air channels.

Another aspect is to provide a foothold including a thermoelectric module, the foothold being able to supply cold air directly to user's feet by forming a cold air discharge portions in a cover of the foothold.

Another aspect is to provide a foothold including a thermoelectric module in which a cold air channel and a heat dissipation channel can be easily formed by having a fan for supplying cold air and a heat dissipation fan.

Another aspect is to provide a foothold including a thermoelectric module in which fins are disposed on the bottom surface of a cover such that air that has passed through the fan for supplying cold air can be distributed to the front portion and the rear portion of the foothold.

Another aspect is to provide a foothold including a thermoelectric module in which the cover of the foothold is detachable, so the cover can be washed.

Another aspect is to provide a foothold including a thermoelectric module in which air discharge portions formed at the center portion of the cover corresponding to the position of the fan for supplying cold air is formed larger in size than the cold air discharge portions formed on the front portion and the rear portion of the foothold, so cold air can be smoothly discharged through the cold air discharge portions that are relatively far from the fan for supplying cold air.

The foothold including a thermoelectric module described in the present disclosure includes a body having a cooling channel in which a cooling fan is provided and a heat dissipation channel in which a heat dissipation fan is provided, and a cover disposed on the body.

A heat dissipation heat sink and a thermoelectric element of the thermoelectric module are disposed in the body.

A heat absorption heat sink being in contact with thermoelectric element is included in the cover.

The cover is detachably coupled to the body.

User's feet F can be placed on the top surface of the cover.

The cover includes a cover plate being in contact with the thermoelectric element formed with a cold air discharge portion configured to discharge air that has passed through the cooling channel.

The cover may further include at least one fin extending from the cover plate and positioned in the cooling channel.

A plurality of channels is included in the cooling channel and the heat dissipation channel may be disposed between the plurality of channels.

A cooling fan may be provided at a lower portion in each of the plurality of channels.

The body may include a first part forming a first channel of the plurality of channels, and a second part forming a second channel.

The first and second channels are formed at center portions of the first and second parts, respectively.

The cover is disposed over the first and second parts, and an intermediate channel is formed between a bottom surface of the cover and top surfaces of the first and second parts.

The at least one fin may extend downward from the cover and may be positioned in the intermediate channel.

The cold air discharge portion may be formed over the intermediate channel.

The cover plate may include a plate protrusion protruding downward from a bottom surface of the cover plate and being in contact with a heat absorption portion of the thermoelectric element.

The foothold further includes a module insulator surrounding the thermoelectric element and having an insulator hole.

The plate protrusion may be inserted into the insulator hole.

The cold air discharge portion may be configured to form a plurality of rows and a plurality of columns.

At least one fin may include a plurality of fins configured to form a plurality of columns.

A column of the plurality of fins may be aligned in a column of the cold air discharge portion.

The body may further include a third part disposed between the first and second parts and forming the heat dissipation channel.

The heat dissipation channel includes: a sink suction side channel forming an air channel from the heat dissipation fan to the heat dissipation heat sink; and a sink discharge side channel extending from the heat dissipation heat sink to a front surface or a rear surface of the body.

The heat dissipation fan is disposed at a lower portion in the body.

The foothold further includes a heat dissipation cover provided on the front surface or the rear surface of the body and being configured to discharge air, which has flowed through the heat dissipation channel.

According to the foothold according to the present disclosure, there is an effect that it is possible to make a user feel pleasant by supplying conditioned air to the lower portion of the user's body, particularly, to the feet.

Further, by supplying cold air to the user's feet using a thermoelectric module, it is possible to configure a compact cold air generator.

Further, by configuring at least two cold air channels, it is possible to effectively supply cold air to the user's both feet.

Further, by configuring a heat dissipation channel between the two cold air channels, air that has passed through the heat dissipation heat sink can smoothly flow.

Further, by forming a cold air discharge portion in the cover of the foothold, it is possible to supply cold air directly to the user's feet.

Further, by separately providing a fan for supplying cold air and a heat dissipation fan, a cold air channel and a heat dissipation channel can be easily formed.

Further, by providing a fin on the bottom surface of the cover, the air that has passed through the fan for supplying cold air can be distributed to the front portion and the rear portion of the foothold.

Further, since the cover of the foothold is detachably provided, the cover can be washed, so it is possible to sanitarily manage the foothold.

Further, the air discharge portions formed at the center portion of the cover corresponding to the position of the fan for supplying cold air is formed larger in size than the cold air discharge portions formed on the front portion and the rear portion of the foothold, so cold air can be smoothly discharged through the cold air discharge portions that are relatively far from the fan for supplying cold air.

DETAILED DESCRIPTION

Figure 1:
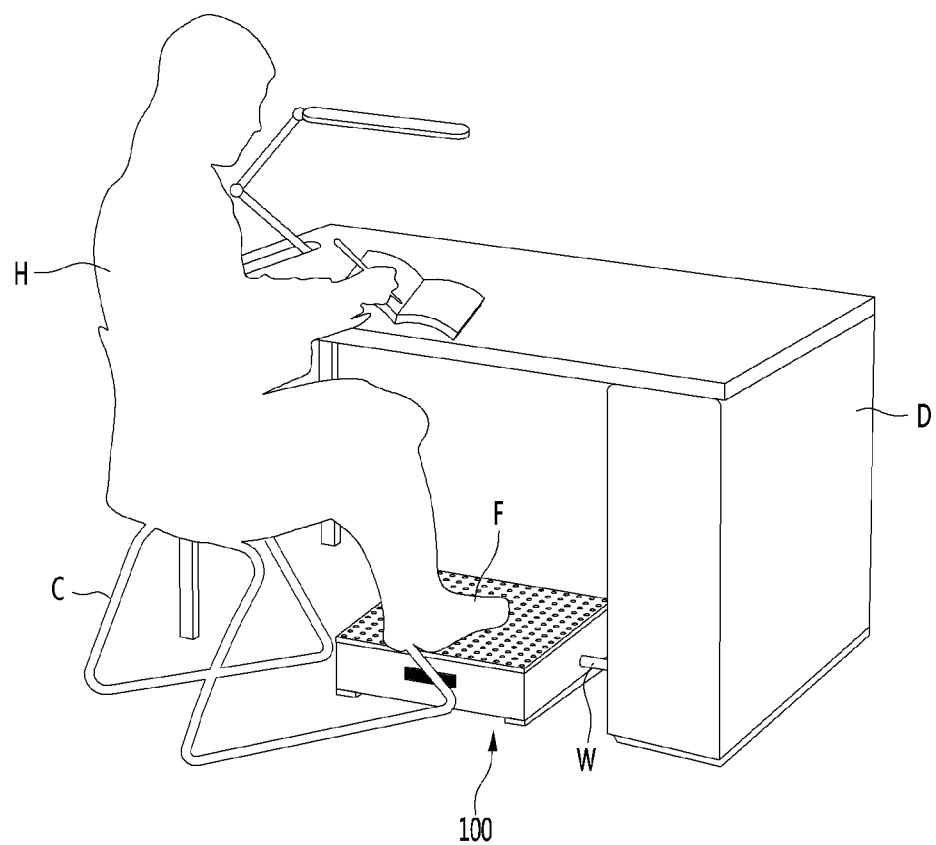
FIG. 1 is a view showing a user using a foothold according to an embodiment of the present disclosure.

Hereinafter, embodiments of the present disclosure are described in detail with reference to exemplary drawings. It should be noted that when components are given reference numerals in the drawings, the same or similar components may be given the same reference numerals even if they are shown in different drawings. Further, in the following description of embodiments of the present disclosure, when detailed description of well-known configurations or functions is determined as obscuring the understanding of the embodiments of the present disclosure, they may be omitted or not described in detail.

Further, terms 'first', 'second', 'A', 'B', '(a)', and '(b)' may be used in the following description of the components of embodiments of the present disclosure. The terms are provided only for discriminating components from other components and, the essence, sequence, or order of the components are not limited by the terms. When a component is described as being "connected", "combined", or "coupled" with another component, it should be understood that the component may be connected or coupled to another component directly or with another component interposing therebetween.

Figure 2:
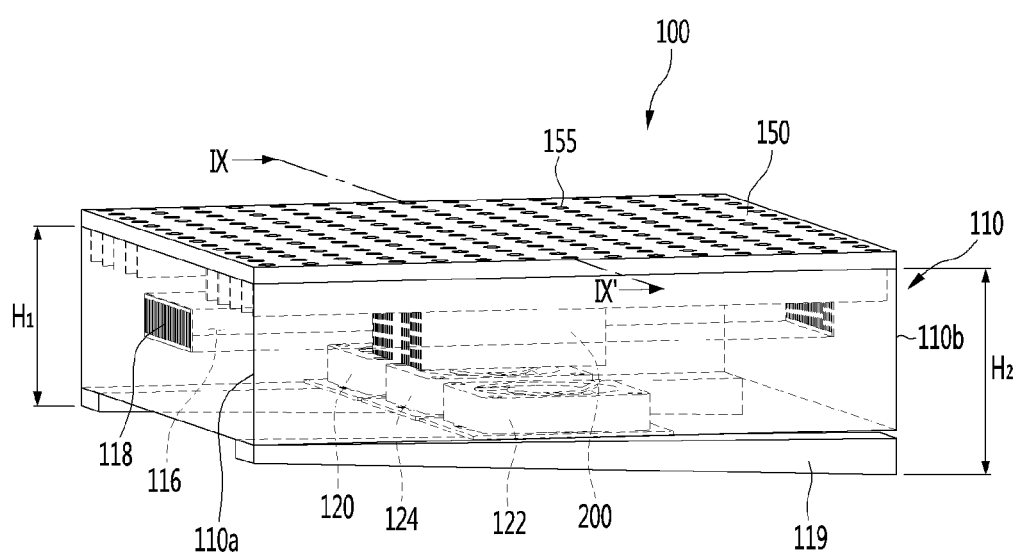
FIG. 2 is a transparent view of an interior of a foothold showing components in dashed lines according to an embodiment of the present disclosure.
Figure 3:
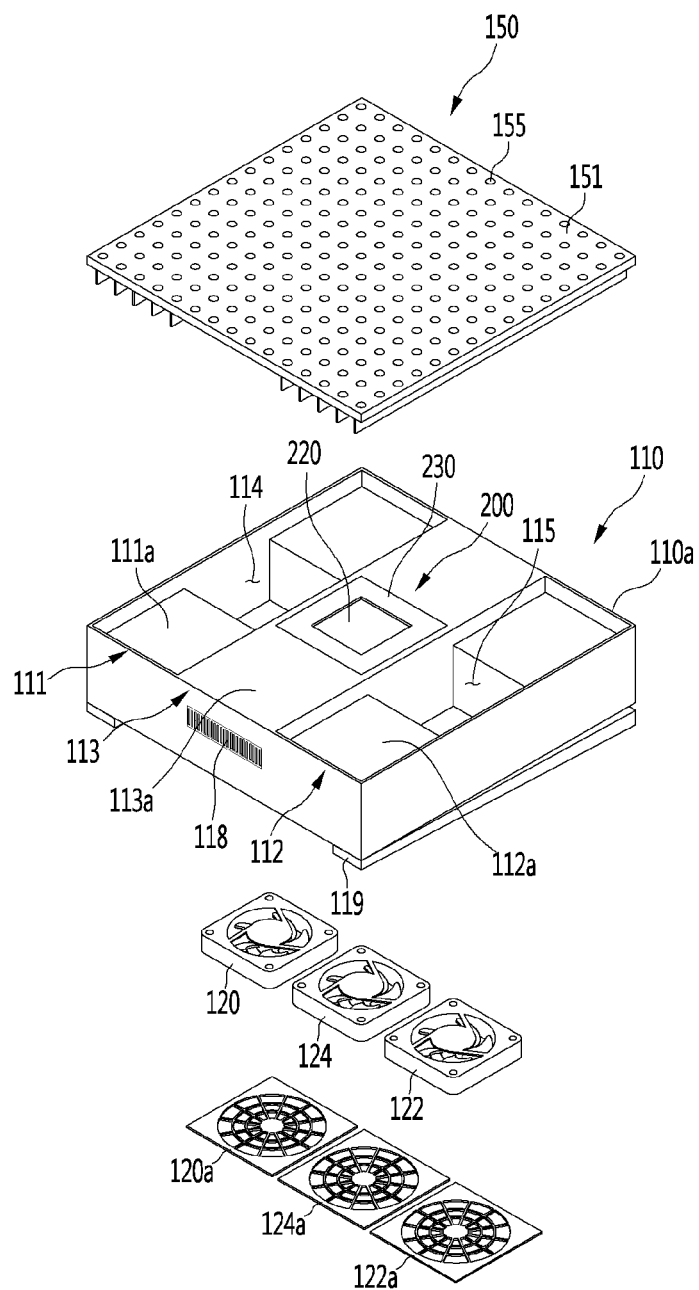
FIG. 3 is an exploded perspective view of a foothold according to an embodiment of the present disclosure.
Figure 4:
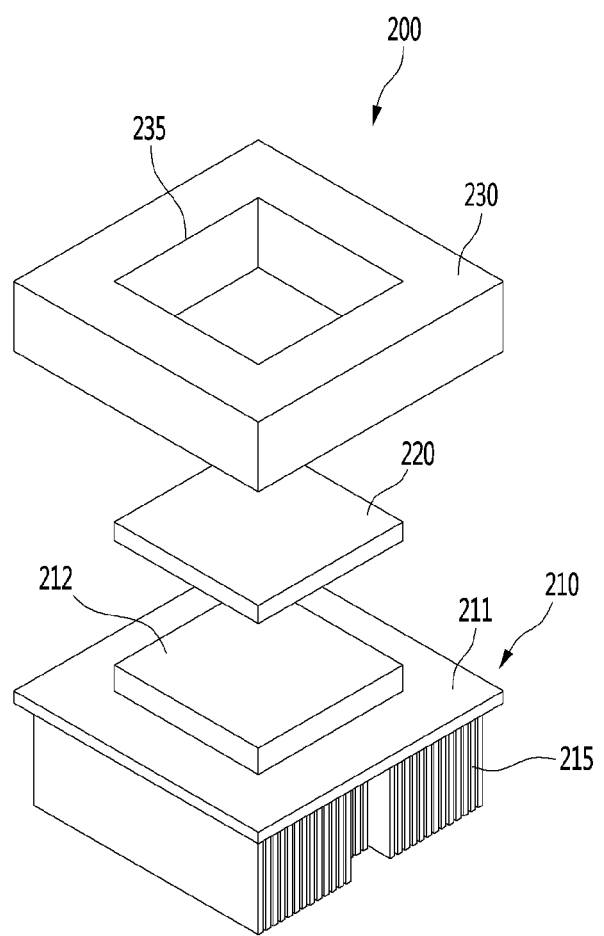
FIG. 4 is an exploded perspective view of a thermoelectric module according to an embodiment of the present disclosure.

FIG. 1 is a view showing a user using a foothold according to an embodiment of the present disclosure, FIG. 2 is a transparent view of an interior of a foothold showing components in dashed lines according to an embodiment of the present invention, FIG. 3 is an exploded perspective view of a foothold according to an embodiment of the present disclosure, and FIG. 4 is an exploded perspective view of a thermoelectric module according to an embodiment of the present disclosure.

Referring to FIG. 1, a user H may use a foothold 100 according to an embodiment of the present disclosure when sitting on a chair C and studying at a desk D.

In detail, the foothold 100 may be positioned in a space under the desk D and the user may place their feet on the top surface of the foothold 100. Further, conditioned air may be discharged and supplied to the user's feet F through the top surface of the foothold 100.

The foothold 100 may be supplied with power through an electrical wire W connected to a power supply. However, the foothold 100 is not limited thereto and may be supplied with power from a battery disposed in the foothold 100.

Referring to FIG. 2, the foothold 100 according to an embodiment of the present disclosure includes a body 110 in which fans 120, 122, and 124 and a thermoelectric module 200 are disposed, and a cover 150 coupled to the top of the body 110 and having an air discharge portion 155.

The cover 150 may be detachably coupled to the body 110. The user may separate the cover 150 from the body 110 and then clean the body 150, and also clean the inside of the body 110. Accordingly, it is possible to sanitarily manage the foothold 100.

The body 110 may have a hexahedral shape with at least a portion of the upper portion open. Further, the body 110 includes a front portion 110a and a rear portion 110b. The front portion 110a may be a portion to which the heels of the user's feet F are positioned close to and the rear portion 110b may be a portion to which the toes are positioned close to.

The foothold 100 may further include legs 119 disposed at the bottom surface of the body 110 to be placed on the floor. The legs 119 may extend from both sides of the front portion 110a of the body 110 toward the rear portion 110b. Further, the legs 119 may extend at an angle such that the height of the legs may be higher at the rear portion than at the front portion.

Through the configuration of the legs 119, the height H2 of the rear portion 110b from the floor may be higher than the height H1 of the front portion 110a from the floor. Further, when the cover 150 is coupled to the top of the body 110 and the user's feet F are placed on the cover 150, the toes of the feet F may be positioned higher than the heels. Accordingly, when the user's feet F are placed on the foothold 100, the user may feel comfortable.

Further, the bottom surface of the body 110 may be spaced a predetermined distance apart from the floor by the legs 119.

The body 110 may include two parts 111 and 112 forming first and second channels 114 and 115 ("air channels") for conditioned air to be supplied to the user, and a third part 113 forming a third channel 116 ("dissipation channel") for heat-exchanged air to be discharged outside. The conditioned air may be cold air or hot air depending on a polarity of the thermoelectric module installed in the foothold. The heat-exchanged air may be corresponding exhausted hot air or cold air depending on the polarity of the thermoelectric module. An operation of the thermoelectric module is well-known and will not be further described. For purposes of describing the present embodiment, the operation where the thermoelectric module generates cold air as conditioned air and hot air as heat-exchanged air to be discharged outside will be described.

The first and second channels 114 and 115 may be referred to as "cooling channels" and the third channel 116 may be referred to as a "heat dissipation channel".

The two parts 111 and 112 include a first part 111 disposed at the left side of the body 110 and forming the first channel 114 and a second part 112 disposed at the right side of the body 110 and forming the second channel 115.

The first and second parts 111 and 112 may be spaced apart left and right. In this configuration, the left-right spaced distance of the first and second parts 111 and 112 may correspond to the distance between both feet F of the user when the user naturally places both feet on the foothold 100.

The first channel 114 may be formed at the center portion of the first part 111 in the front-rear direction. The first channel 114 may be formed in the up-down direction through a portion of the body 110. A first fan 120 for introducing external air into the first channel 114 may be disposed at a lower portion of the first channel 114. For example, the first fan 120 may be an axial fan and the like.

Further, a first fan cover 120a may be disposed under the first fan 120. The first fan cover 120a may form a portion of the bottom surface of the body 110 and may be spaced upward apart from the floor. Further, the first fan cover 120a may include a grill structure for preventing entry of foreign substances.

The second channel 115 may be formed at the center portion of the second part 112 in the front-rear direction. The second channel 115 may be formed in the up-down direction through a portion of the body 110. A second fan 122 for introducing external air into the second channel 115 may be disposed at a lower portion of the second channel 115. For example, the second fan 122 may be an axial fan and the like. The first and second fan 120 and 122 may be referred to as a "cooling fan" in combination.

Further, a second fan cover 122a may be disposed under the second fan 122. The second fan cover 122a may form another portion of the bottom surface of the body 110 and may be spaced upward apart from the floor. Further, the second fan cover 122a may include a grill structure for preventing entry of foreign substances.

The third part 113 may be disposed between the first and second parts 111 and 112. A thermoelectric module 200 for generating cold air may be disposed at the third part 113. The foothold 100 may not include parts for operating a refrigeration cycle, for example, parts generating loud noise such as a compressor, so an effect of reducing noise while the foothold 100 is operated may be obtained.

The thermoelectric module 200 may be formed at the center portion of the third part 113 in the front-rear direction. Thus, the thermoelectric module 200 may be disposed between the first channel 114 and the second channel 115.

The thermoelectric module 200 may include a heat dissipation heat sink 210 being in contact with a thermoelectric element 220. The heat dissipation heat sink 210 may include a heat sink main body 211 having a substantially square or rectangular plate shape, and an element coupling portion 212 that protrudes from the top surface of the heat sink main body 211 and to which the thermoelectric element 220 may be attached or fastened.

The thermoelectric element 220 may be an element that implements cooling and heat generation using Peltier effect. A heat absorption side of the thermoelectric element may be disposed to face the upper portion of the body 110 and a heat dissipation side of the thermoelectric element may be disposed to face the lower portion of the body 110 during cooling. During heating, the heat dissipation side of the thermoelectric element may be disposed to face the upper portion of the body 110 and the heat absorption side of the thermoelectric element may be disposed to face the lower portion of the body 110.

The heat dissipation heat sink 210 may include a heat sink fin 215 that is disposed under the heat sink main body 211 and exchanges heat with air suctioned through the third channel 116. The heat sink fin 215 may be a plurality of pieces, such as fins, and the plurality of fins may be coupled to the bottom surface of the heat sink main body 211 and may extend downward.

The thermoelectric module 200 may further include a heat absorption heat sink that is disposed over the module main body 210 and exchanges heat with air suctioned through the first and second channels 114 and 115. The cover 150 may be configured as a heat absorption heat sink.

The heat absorption heat sink 150 (cover) may be disposed in contact with the heat absorption portion at the upper portion of the thermoelectric element 220 and the heat dissipation heat sink 210 may be disposed in contact with a heat dissipation portion at the lower portion of the thermoelectric element 220. The heat absorption portion and the heat dissipation portion of the thermoelectric element may have a shape that comes in surface contact, and may form opposite surfaces.

The thermoelectric element module 200 may further include a module insulator 230 disposed between the heat absorption heat sink 150 and the heat dissipation heat sink 210. For example, the module insulator 230 may be disposed to surround the edge of the thermoelectric element 220.

An insulator opening 235 may be formed at the module insulator 230. The insulator opening 235 may be formed in a hole shape opening through the top and bottom surfaces of the module insulator 230.

A plate protrusion 152 (see FIG. 5) of the cover 150 may be inserted in the insulator opening 235 to contact with the thermoelectric element 220. The thermoelectric element 220 may be positioned in the insulator opening 235.

A third fan 124 for introducing external air may be disposed under the third part 113. The third fan 124 may be an axial fan and the like. Further, a third fan cover 124a may be disposed under the third fan 124. The third fan cover 124a may form another portion of the bottom surface of the body 110 and may be spaced upward apart from the floor. Further, the third fan cover 124a may include a grill structure for preventing entry of foreign substances. The third fan 124 may be referred to as a "heat dissipation fan".

The body 110 may include a heat dissipation cover 118 through which air heated through the heat dissipation heat sink 210 may be discharged. For example, the heat dissipation cover 118 may be disposed at one or more side surfaces, for example, the front surface and the rear surface of the body 110. The heat dissipation covers 118 may be disposed to cover the ends of the third channel 116.

In detail, the third channel 116 may be an air channel, such as a heat dissipation channel through which the air suctioned through the third fan 123 may be discharged toward the heat dissipation covers 118 after passing through the heat dissipation heat sink 210. The heat dissipation channel 116 may include a sink suction side channel 116a (see FIG. 11) forming an air channel from the third fan 124 to the heat dissipation heat sink 210, and a sink discharge side channel 116b (see FIG. 12) forming an air channel from the heat dissipation heat sink 210 to the hat dissipation cover 118.

The sink suction side channel 116a and the sink discharge side channel 116b may be channels formed in the third part 113.

In detail, the sink suction side channel 116a may be formed toward the heat dissipation heat sink 210 from the bottom surface of the body 110 and may be formed at the center portion of the third part 113 in the front-rear direction. Further, the sink discharge side channel 116b may be formed toward one or more side surfaces, for example, the front surface and the rear surface of the body 110 from the heat dissipation heat sink 210 and may be formed toward the front portion (and the rear portion) from the center portion of the third part 113.

The top surface 111a of the first part 111 and the top surface 112a of the second part 112 may be formed lower than the top surface 113a of the third part 113. Further, the top surface 111a of the first part 111 and the top surface 112a of the second part 112 may be positioned lower than the top surface 110a of the body 110.

When the cover 150 is coupled to the top of the body 110, a predetermined space may be formed between the bottom surface of the cover 150 and the top surface of the first part 111. The predetermined space may form a first intermediate channel 114a (see FIG. 9) that may transmit the air passing through the first channel 114 to the cold air discharge portion 155 of the cover 150. The first intermediate channel 114a is one component of the cooling channel and may be a channel formed in the front-rear direction over the first channel 114.

Similarly, a predetermined space may be formed between the bottom surface of the cover 150 and the top surface of the second part 112. The predetermined space may form a second intermediate channel 115a (see FIG. 9) that may transmit the air passing through the second channel 115 to the cold air discharge portion 155 of the cover 150. The second intermediate channel 115a is one component of the cooling channel and may be a channel formed in the front-rear direction over the second channel 115. Further, the first intermediate channel 114a and the second intermediate channel 115a may be referred to as an "intermediate channel" in combination.

Figure 5:
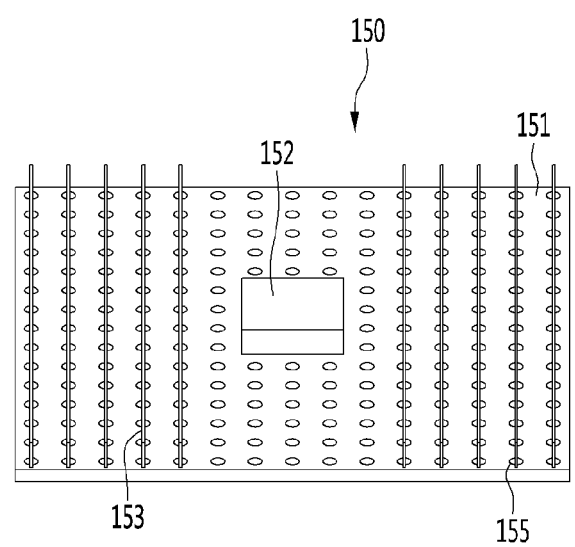
FIG. 5 is a bottom view showing a cover configuration of a foothold according to an embodiment of the present disclosure.
Figure 6:
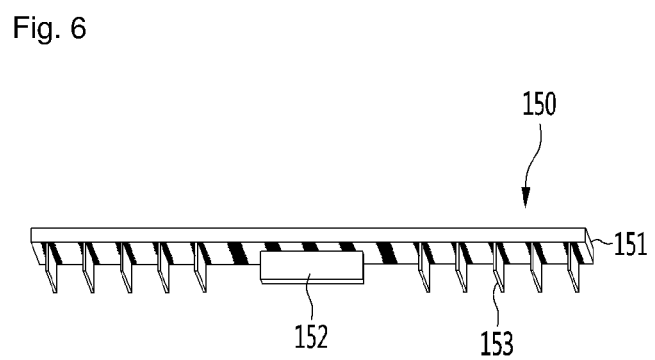
FIG. 6 is a front view showing a cover configuration of a foothold according to an embodiment of the present disclosure.
Figure 7:
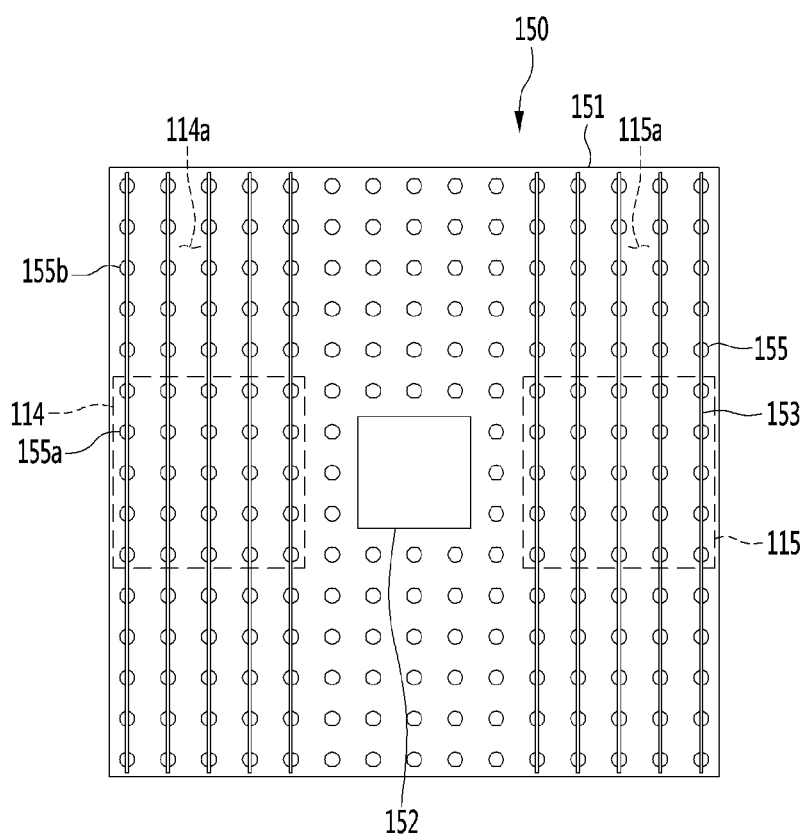
FIG. 7 is a plan opened-up view showing a cover configuration of a foothold according to an embodiment of the present disclosure.
Figure 8:
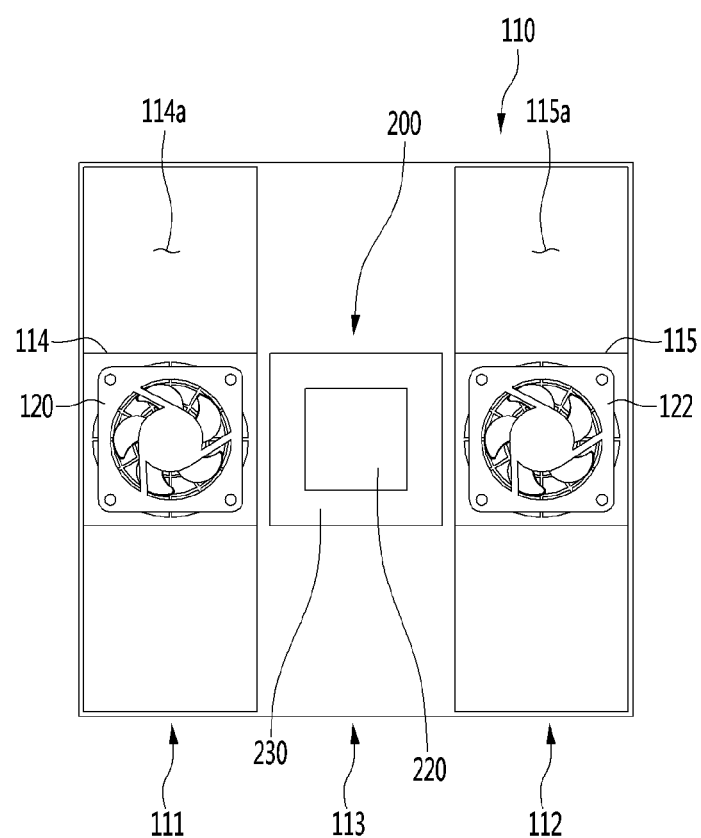
FIG. 8 is a plan view showing a body configuration of a foothold according to an embodiment of the present disclosure.

FIG. 5 is a bottom view showing a cover configuration of a foothold according to an embodiment of the present disclosure, FIG. 6 is a front view showing a cover configuration of a foothold according to an embodiment of the present disclosure, FIG. 7 is a plan opened-up view showing a cover configuration of a foothold according to an embodiment of the present disclosure, and FIG. 8 is a plan view showing a body configuration of a foothold according to an embodiment of the present disclosure.

Referring to FIGS. 5 to 8, the foothold 100 according to an embodiment of the present disclosure includes the cover 150 covering the top of the body 110.

The cover 150 includes the cover plate 151 formed with a cold air discharge portion 155, and a fin 153 disposed at the bottom surface of the cover plate 151 and guiding air, which has flowed through the first channel 114 or the second channel 115, towards the cold air discharge portion 155.

In detail, the cover plate 151 may have a substantially square or rectangular plate shape. Further, the cold air discharge portion 155 may be formed through at least a portion of the cover plate 151.

The cold air discharge portion 155 may be a plurality of pieces, such as holes, and the plurality of cold air discharge portions 155 may be uniformly distributed at the cover plate 151. The cold air discharge portions 155 are disposed to have a structure with a plurality of rows and a plurality of columns, that is, a matrix structure. For example, the plurality of cold air discharge portions 155 may be disposed to have a matrix structure with ten or more rows and ten or more columns.

The fin 153 is coupled to the bottom surface of the cover plate 151 and may extend downward toward the first and second intermediate channels 114a and 115a. That is, the fin 153 may be disposed in the first and second intermediate channels 114a and 115a.

Further, the fin 153 may be elongated in the front-rear direction of the body 110. Accordingly, the air flowing from the first channel 114 to the first intermediate channel 114a may be guided by the fin 153, so that the air may diverge toward to the front portion and the rear portion of the first part 111. Further, the air may flow upward and be discharged through the cold air discharge portions 155 of the cover plate 151.

The lower ends of the fins 153 may be disposed at a position spaced apart from each other upwardly from the top surface 111a of the first part 111 and the top surface 112a of the second part 112. Accordingly, interference with the flow of the air flowing through the first intermediate channel 114a or the second intermediate channel 115a by the fin 153 may be prevented.

The fin 153 may be a plurality of pieces, such as fins, and the plurality of fins 153 may be arranged and spaced apart from each other in the left-right direction of the cover 150.

For example, the plurality of fins 153 may be configured to make ten columns in the left-right direction. However, the number of the fins 153 is not limited thereto.

Further, the fins 153 may extend in the front-rear direction from the bottom surface of the cover plate 151.

The cover 150 may include the plate protrusion 152 disposed on the cover plate 151 and being in contact with the heat absorption portion of the thermoelectric element 220. The plate protrusion 152 may protrude downward from the bottom surface of the cover plate 151 and may be inserted in the insulator opening 235 of the module insulator 230. The plate protrusion 152 may be in contact with the thermoelectric element 200 positioned in the insulator opening 235.

The plate protrusion 152 may be cooled by the heat absorption portion of the thermoelectric element 200, and the cover plate 151 and the fins 153 may be cooled by conduction through the plate protrusion 152. That is, the cover 150 may be one component of the heat absorption heat sink of the thermoelectric module 200.

As a result, the top surface of the cover plate 151 may be brought in direct contact with the feet of the user, thereby being able to supply coolness to the user. Further, the air that has flowed through the first and second channels 114 and 115 is cooled by exchanging heat with the fins 153, and the cooled air is discharged upward through the cold air discharge portions 155, thereby being able to supply cold air to the user.

Referring to FIG. 7, the fins 153 of the cover 150 may be arranged under the cold air discharge portions 155. In detail, the cold air discharge portion 155 form a matrix structure and the fins 153 may be arranged in a plurality of columns in the left-right direction. The first column of the cold air discharge portions 155 may be aligned with the first column of the fins 153, and the second column of the cold air discharge portions 155 may be aligned with the second column of the fins 153. Similarly, the third column of the cold air discharge portions 155 may be aligned with the third column of the fins 153, and the fourth column of the cold air discharge portions 155 may be aligned with the fourth column of the fins 153 and so forth.

The transverse width of the fin 153 may be smaller than the diameter of the cold air discharge portion 155. For example, the diameter of the cold air discharge portion 155 may be three or more times larger than the transverse width of the fin 153. Accordingly, it may be possible to prevent the old air discharge portion 155 from being clogged with the fins 153 and increasing the flow resistance of cold air.

The cold air discharge portions 155 may include a center discharge portion 155a positioned over the first channel 114 or the second channel 115, and side discharge portions 155b positioned over the first and second intermediate channels 114a and 115a.

The center discharge portion 155a may be positioned at the center portion of the cover plate 151 in the front-rear direction, that is, may be positioned over the first fan 120 or the second fan 122. Further, the side discharge portions 155b may be positioned on the front portion and the rear portion of the cover plate 151. Accordingly, the distance from the first and second fans 120 and 122 to the side discharge portions 155b may be longer than the distance from the first and second fans 120 and 122 to the center discharge portion 155a.

Accordingly, in terms of flow resistance, the cold air may have a tendency to be intensively discharged through the center discharge portion 155a rather than through the side discharge portions 155b. In order to solve this problem, in the present embodiment, the size of the side discharge portions 155b may be larger than the size of the center discharge portion 155a. In this case, the cold air may be uniformly discharged through the center discharge portion 155a and the side discharge portions 155b.

At the bottom surface of the cover plate 151, the region positioned over the third part 113 may correspond to the space between both feet F of the user, and may require relatively less supply of cold air. Accordingly, the fin 153 may not be needed in that region and may not be provided.

The gap between the bottom surface of the cover plate 151 and the top surface 113a of the third part 113 may not be large such that the fin 153 is positioned. According to this configuration, the gap between the cover 150 and the body 110 may be reduced, so the foothold 100 may be made more compact.

The top surfaces 111a and 112a of the first and second parts 111 and 112 and the top surface 113a of the third part 113 may not be divided, and some of the air cooled by the fins 153 may be discharged to the cold air discharge portions 155 of the cover 150 through the top surface 113a of the third part 113. Accordingly, the cold air discharge portions 155 may be formed in the portion positioned over the third part 113 of the cover plate 151.

Figure 9:
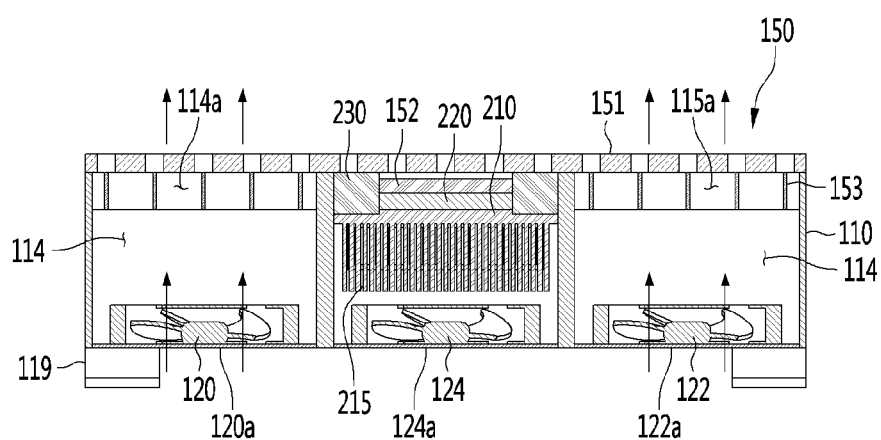
FIG. 9 is a cross-sectional view taken along line IX-IX' of FIG. 2 and showing a formed cold air channel.
Figure 10:
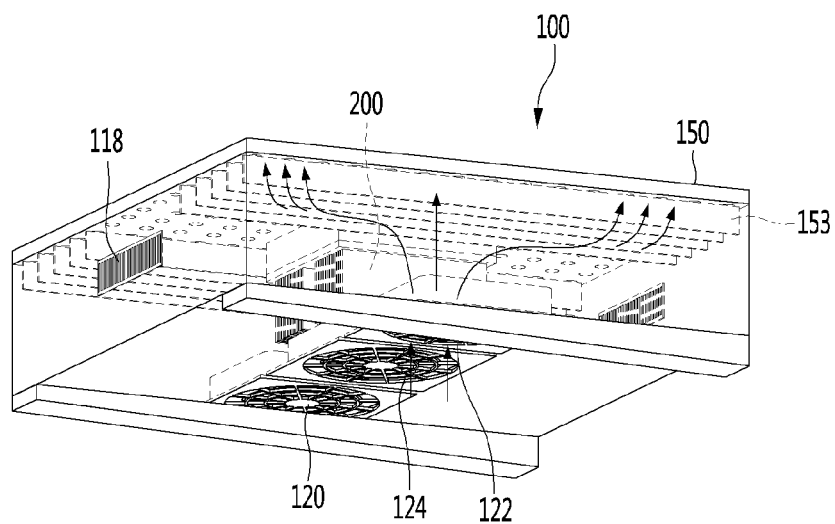
FIG. 10 is a transparent bottom perspective view showing a formed cold air channel through a foothold according to an embodiment of the present disclosure.
Figure 13:
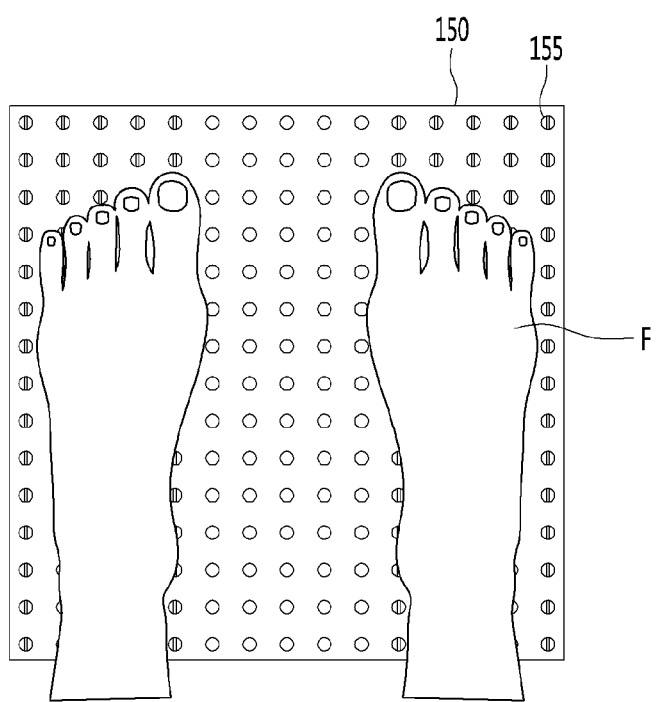
FIG. 13 is a plan view showing user's feet placed on the cover of a foothold according to an embodiment of the present disclosure.

FIG. 9 is a cross-sectional view taken along line IX-IX' of FIG. 2 and showing a formed cold air channel, FIG. 10 is a transparent bottom perspective view showing a formed cold air channel through a foothold according to an embodiment of the present disclosure, and FIG. 13 is a plan view showing user's feet placed on the cover of a foothold according to an embodiment of the present disclosure. A process in which cold air produced through the thermoelectric module 200 is discharged is described with reference to the drawings.

Referring to FIGS. 9 and 10, when the first and second fans 120 and 122 are operated, air is suctioned from under the foothold 100. The air suctioned through the first fan 120 flows upward through the first channel 114, and the air suctioned through the second fan 130 flows upward through the second channel 115.

The air in the first channel 114 flows to the front portion and the rear portion of the first part 111 and flows through the first intermediate channel 114a. In this process, the fins 153 disposed at the cover 150 guide the air flowing through the first intermediate channel 114a and cool the air. Further, the cooled air may be discharged through the cold air discharge portions 155 of the cover 150.

The air in the second channel 115 flows to the front portion and the rear portion of the second part 112 and flows through the second intermediate channel 115a. In this process, the fins 153 disposed at the cover 150 guide the air flowing through the second intermediate channel 115a and cool the air. Further, the cooled air may be discharged through the cold air discharge portions 155 of the cover 150.

According to this operation, the air suctioned through the first and second fans 120 and 122 is cooled through the fins 153 and uniformly diverged to the front portion and the rear portion of the cover 150. Further, the air is discharged through the cold air discharge portions 155.

Referring to FIG. 13, the user with their feet F on the top surface of the cover 150 may feel cool by contact of the feet with the cover 150 cooled by the thermoelectric module 200 and the cold air discharged through the cold air discharge portions 155.

Figure 11:
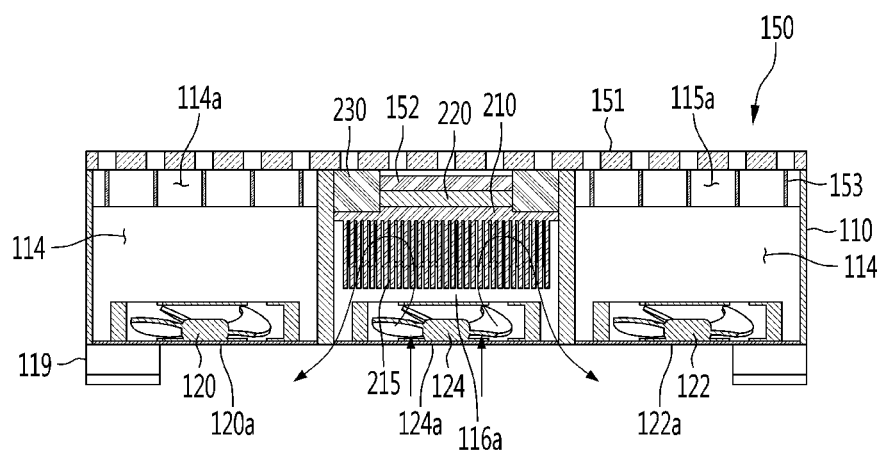
FIG. 11 is a cross-sectional view showing a formed heat dissipation channel through a foothold according to an embodiment of the present disclosure.
Figure 12:
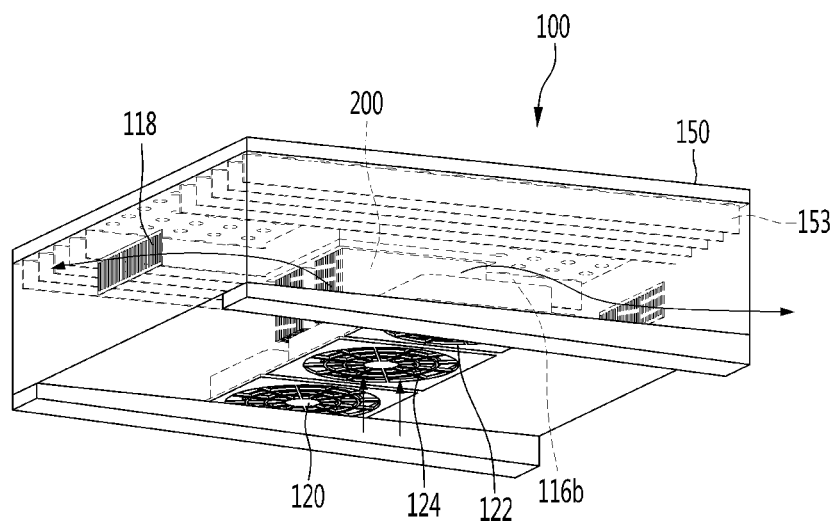
FIG. 12 is a transparent bottom perspective view showing a formed heat dissipation channel through a foothold according to an embodiment of the present disclosure.

FIG. 11 is a cross-sectional view showing a formed heat dissipation channel through a foothold according to an embodiment of the present disclosure and FIG. 12 is a transparent bottom perspective view showing a formed heat dissipation channel through a foothold according to an embodiment of the present disclosure.

Referring to FIGS. 11 and 12, when the third fan 124 is operated, air is suctioned from under the foothold 100. The air suctioned through the third fan 124 flows upward through the sink suction side channel 116a and keeps flowing toward the heat dissipation heat sink 210.

The air heated through the heat dissipation heat sink 210 diverges to the front portion and the rear portion of the third part 113 through the sink discharge side channel 116b. In this process, since the space over the heat dissipation heat sink 210 is closed by the module insulator 230, the heated air flowing into the first channel 114 or the second channel 115 may be restricted.

The heat dissipation cover 118 is disposed on the front portion and the rear portion of the third part 113 and may be disposed at the ends of the sink discharge side channel 116b. Accordingly, the air that has flown through the sink discharge side channel 116b may be discharged out of the foothold 100 through the heat dissipation covers 118.

According to this operation, the high-temperature air that has passed through the heat dissipation heat sink 210 of the thermoelectric module 200 is discharged forward and rearward from the foothold 100, so direct transmission to the user may be prevented.

Further, since the high-temperature air is not mixed with the low-temperature air discharged upward through the heat absorption heat sink 150 (cover), it is possible to prevent a loss of cold air that is transmitted to the user.

Another operation is described.

According to the embodiment described above, the cold air discharge portions are formed on the top surface of the foothold 100 and the heat dissipation covers are disposed on the front and rear surface of the foothold 100, whereby cold air is supplied to a user.

However, as another operation, a heat dissipation cover or hot air discharge portions may be disposed on the top surface of the foothold 100 and cold air discharge portions or cold air covers may be disposed on the front and rear surfaces of the foothold 100, whereby hot air may be supplied to a user. When a countercurrent is applied to the thermoelectric module, the heat dissipation heat sink and the heat absorption heat sink are switched, so hot air is supplied to the top surface of the foothold 100 and cold air is discharged to the front and rear surfaces of the foothold 100, thereby the above configuration may be achieved.

In this case, a cover that functions as a heat dissipation heat sink is disposed over the thermoelectric element, thereby being able to perform heat supply to the user through hot air or conduction. Further, a heat absorption heat sink may be disposed under the thermoelectric element such that cooled air may be discharged through the front surface and the rear surface of the foothold.

What is claimed is:

1. A foothold comprising:
a body having an air channel in which a suction fan is provided and a dissipation channel in which a dissipation fan is provided;
a dissipation heat sink provided in the body, the dissipation heat sink being positioned in the dissipation channel;
a cover disposed to cover the body and having a top surface on which a user's feet are placed; and
a thermoelectric element disposed between the dissipation heat sink and the cover, wherein the cover includes:
a cover plate to contact with the thermoelectric element, the cover plate including an air discharge portion to discharge air that has passed through the air channel; and
at least one fin extending from the cover plate, the at least one fin being positioned in the air channel.

2. The foothold of claim 1, wherein the air channel includes a first channel and a second channel, and
the dissipation channel is disposed between the first and second channels.

3. The foothold of claim 2, wherein the suction fan includes:
a first fan disposed at a lower portion of the body to force the air to flow through the first channel; and
a second fan disposed at a lower portion of the body to force the air to flow through the second channel.

4. The foothold of claim 2, wherein the body includes a first part forming the first channel and a second part forming the second channel, and
the first and second channels are disposed at center portions of the first and second parts, respectively.

5. The foothold of claim 4, wherein the cover is disposed over the first and second parts, and
an intermediate channel is formed between a bottom surface of the cover and top surfaces of the first and second parts.

6. The foothold of claim 5, wherein the at least one fin extends downward from the cover and is positioned in the intermediate channel.

7. The foothold of claim 6, wherein the at least one fin extends in a front-rear direction from a bottom surface of the cover and guides the air, which has passed through the first and second channels, to front portions and rear portions of the first and second parts.

8. The foothold of claim 1, wherein the air discharge portion is disposed over the intermediate channel.

9. The foothold of claim 1, wherein the cover is detachably coupled to the body.

10. The foothold of claim 1, wherein the cover plate includes a plate protrusion protruding downward from a bottom surface of the cover plate and being in contact with a heat absorption/dissipation portion of the thermoelectric element.

11. The foothold of claim 10, further comprising a module insulator surrounding the thermoelectric element and having an insulator hole,
wherein the plate protrusion is inserted into the insulator hole.

12. The foothold of claim 1, wherein the air discharge portion is formed in a plurality of rows and a plurality of columns, and
the at least one fin comprises a plurality of fins formed in a plurality of columns.

13. The foothold of claim 12, wherein a column of the plurality of fins is aligned in a column of the air discharge portion.

14. The foothold of claim 4, wherein the body further includes a third part disposed between the first and second parts, the third part forming the dissipation channel.

15. The foothold of claim 14, wherein the dissipation channel includes:
a sink suction side channel formed from the dissipation fan to the dissipation heat sink; and
a sink discharge side channel extending from the dissipation heat sink to a side surface of the body.

16. The foothold of claim 15, wherein the dissipation fan is disposed at a lower portion of the body.

17. The foothold of claim 15, further comprising a dissipation cover provided on the side surface of the body, the dissipation cover to discharge the air which has flowed through the dissipation channel.

18. A foothold comprising:
- a body having an air channel and a dissipation channel;
- a suction fan provided in the air channel;
- a dissipation fan provided in the dissipation channel;
- a dissipation heat sink provided in the body, the dissipation heat sink being positioned in the dissipation channel; and
- a cover plate disposed to cover the body, the cover plate including an air discharge portion to discharge air that has passed through the air channel, and
- a thermoelectric element disposed between the dissipation heat sink and the cover.

19. The foothold of claim 18, wherein the foothold further includes at least one fin protruding downward from a bottom surface of the cover plate and positioned in the air channel.

20. The foothold of claim 18, wherein the air channel comprises a plurality of air channels and the heat dissipation channel is disposed between the plurality of air channels.

\* \* \* \* \*